United States Patent
Kaneko

(10) Patent No.: US 7,141,864 B2
(45) Date of Patent: Nov. 28, 2006

(54) GROUPED CAPACITIVE ELEMENT

(75) Inventor: Satoru Kaneko, Kumagaya (JP)

(73) Assignee: Sanyo Electric Co, Ltd., Osaka (JP)

( * ) Notice: Subject to any disclaimer, the term of this patent is extended or adjusted under 35 U.S.C. 154(b) by 0 days.

(21) Appl. No.: 10/893,643

(22) Filed: Jul. 15, 2004

(65) Prior Publication Data
US 2005/0029623 A1   Feb. 10, 2005

(30) Foreign Application Priority Data
Jul. 15, 2003   (JP) .............. 2003-197067

(51) Int. Cl.
*H01L 29/00* (2006.01)
(52) U.S. Cl. ............... 257/532; 257/71; 257/296; 257/534; 257/599
(58) Field of Classification Search ........ 257/532, 257/68, 71, 295–313, 905–908, 534, 599
See application file for complete search history.

(56) References Cited

U.S. PATENT DOCUMENTS

| | | |
|---|---|---|
| 5,083,184 A | 1/1992 | Eguchi |
| 5,747,375 A | 5/1998 | Kaneko |
| 2003/0006481 A1* | 1/2003 | Miyada et al. .............. 257/532 |

FOREIGN PATENT DOCUMENTS

JP   11-312784   11/1999

* cited by examiner

*Primary Examiner*—Nathan J. Flynn
*Assistant Examiner*—Scott R. Wilson
(74) *Attorney, Agent, or Firm*—SoCal IP Law Group LLP; Steven C. Seraboff

(57) ABSTRACT

There is disclosed a semiconductor device comprising at least one capacitive element group having a plurality of unit capacitive elements. At least one lead-out electrode for bottom electrodes of the unit capacitive elements of the capacitive element group is provided along a circumference going around top electrodes as a whole of the capacitive element group. The at least one lead-out electrode is provided so as to surround the top electrodes as a whole of the capacitive element group.

6 Claims, 7 Drawing Sheets

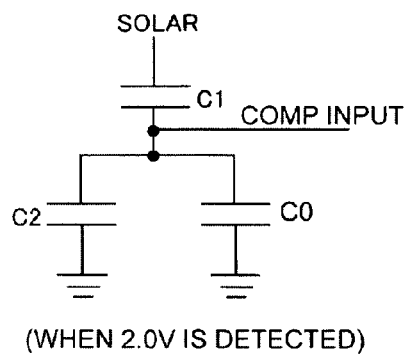
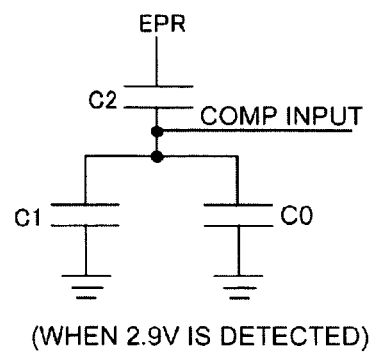
FIG. 3A (WHEN 2.0V IS DETECTED)
FIG. 3B (WHEN 2.9V IS DETECTED)
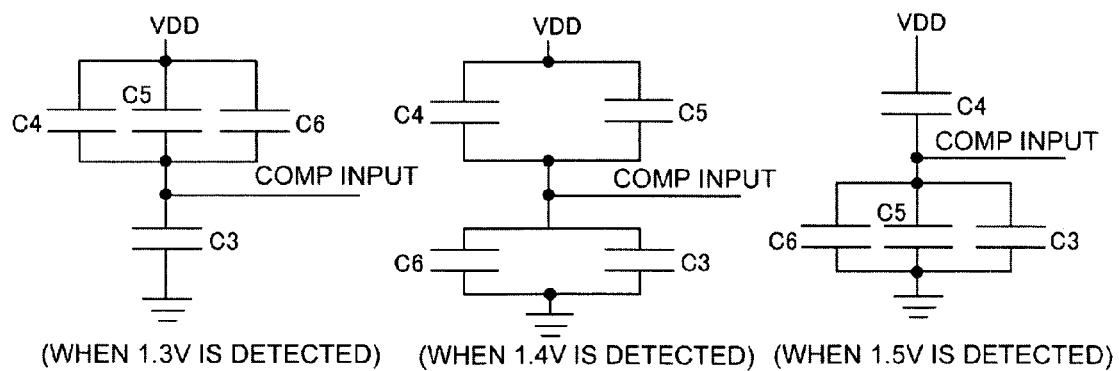
FIG. 4A (WHEN 1.3V IS DETECTED)
FIG. 4B (WHEN 1.4V IS DETECTED)
FIG. 4C (WHEN 1.5V IS DETECTED)

GROUPED CAPACITIVE ELEMENT

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by any one of the patent disclosure as it appears in the Patent and Trademark Office patent files or records, but otherwise reserves all copyright and trade dress rights whatsoever.

RELATED APPLICATION INFORMATION

The present application claims priority upon Japanese Patent Application No. 2003-197067 filed on Jul. 15, 2003, which is herein incorporated by reference.

BACKGROUND OF THE INVENTION

1. Field of the Invention

The present invention relates to a semiconductor device.

2. Description of the Related Art

A semiconductor device is known that incorporates a plurality of capacitive elements. Such a semiconductor device is configured, for example, with bipolar integrated circuits. See, for example, Japanese Patent Application Laid-open Publication No. 1999-312784. FIG. 6 shows an example of a cross-sectional structure of a unit capacitive element used in the bipolar integrated circuit. As shown in FIG. 6, a unit capacitive element Cy comprises a P-type semiconductor substrate 1, a P-type isolation region 2, an island region 3 made up of an N-type layer surrounded by the isolation region 2, an N-type bottom electrode region 4 formed on the surface of the island region, an oxide film 5, a dielectric thin film 6 such as silicon nitride film, an aluminum top electrode 7 and a lead-out electrode 8 of a bottom electrode. Its capacitance value is roughly determined by the area of the dielectric thin film 6 in contact with the surface of the bottom electrode 4. This area is equal to the area of an opening portion 5a cleared of the oxide film 5 covering the bottom electrode 4.

As shown in a plan view of FIG. 7, capacitive element groups Ca and Cb are configured through parallel connection of the unit capacitive elements Cy. In the case of a capacitance ratio of 5:15 (1:3), five of the unit capacitive elements Cy are arranged side by side to form the capacitive element Ca. On the other hand, 15 of the unit capacitive elements Cy are arranged side by side to form the capacitive element Cb. The unit capacitive elements Cy of each of the capacitive element groups Ca and Cb are connected to a respective common electrode 12, 13 with connection electrodes 11.

The unit capacitive elements Cy making up each of the capacitive element groups Ca and Cb are connected in parallel each by the electrode wire 11 connected to the top electrode 7. In the case of a three-layer aluminum wiring, the electrode wire is formed by the third wire layer, i.e., the wire layer located at the topmost. The bottom electrode 4 of each of the unit capacitive elements Cy is connected to ground potential GND.

Configuring the above capacitive element groups Ca and Cb presents problems in layout pattern of the unit capacitive elements Cy. That is, it is necessary, out of demands for downsizing and higher accuracy of semiconductor devices, to use the smallest possible unit capacitive elements for capacitive element groups for highly accurate capacitance value and capacitance ratio.

In general, however, the smaller the capacitance value of the unit capacitive element Cy for smaller area, the poorer the accuracy of the capacitance value and capacitance ratio. For this reason, ingenuity is required for the layout pattern of the unit capacitive element Cy to reduce the area without degrading their accuracy.

The aforementioned prior-art layout method shown in FIG. 7, however, has been unfit for downsizing. That is, it is necessary to first route the connection electrode 11 for connection with the common electrode 12 or 13 for each of the unit capacitive elements Cy in the capacitive element group Ca or Cb, thus inhibiting downsizing. This aspect is also true when a connection electrode 11 is routed for connecting a common electrode to the lead-out electrode 8.

The plurality of capacitive element groups Ca and Cb are arranged on the same integrated circuit. This results in the connection electrodes 11 and the common electrode 12, 13 being arranged for each of the capacitive element groups, thus inhibiting downsizing.

SUMMARY OF THE INVENTION

According to a first aspect of the present invention there is provided a semiconductor device comprising at least one capacitive element group having a plurality of unit capacitive elements, wherein at least one lead-out electrode for bottom electrodes of the unit capacitive elements of the capacitive element group is provided along a circumference around top electrodes as a whole of the capacitive element group.

It is therefore unnecessary to route the lead-out electrode for each of the unit capacitive elements, allowing downsizing of the semiconductor device through area reduction of the capacitive element group and providing improved patterning accuracy as a result of easier patterning. This in turn leads to improved accuracy in capacitance ratio.

The at least one lead-out electrode is provided so as to surround the top electrodes as a whole of the capacitive element group. This ensures further reduction of the capacitive element group in area. Since the lead-out electrode is provided so as to surround the top electrodes as a whole, the connection of the lead-out electrode with external and other circuitry is facilitated.

Further, the unit capacitive elements can be identical at least in each of the at least one capacitive element group. Identicalness of the unit capacitive elements ensures enhanced patterning accuracy, thus providing improved accuracy of capacitance ratio.

Yet further, all the bottom electrodes of the unit capacitive elements are connected with each other.

The unit capacitive elements are arranged in grid form, with the top electrodes of the unit capacitive elements adjacent to each other joined together in each of the at least one capacitive element group. This eliminates the need to form a wiring pattern for drawing out the top electrode 7 outwards for each of the unit capacitive elements Cu, making it possible to mount the unit capacitive elements at high density and thereby ensuring further reduction of the capacitive element groups in area. This leads to further downsizing of the semiconductor device. Arrangement of the unit capacitive elements in grid form provides improved patterning accuracy, thus ensuring improved accuracy in capacitance ratio.

Still further, a portion of the at least one lead-out electrode of the capacitive element group is cut, and an external connection terminal for at least one of the top electrodes is extendable outwards through the cut. This allows outward extension of the external connection terminal of the top electrode without the terminal overlapping with the lead-out electrode.

Further, a plurality of the capacitive element groups are formed in the semiconductor device, and there is provided at least one lead-out electrode for the bottom electrodes of the unit capacitive elements of the plurality of capacitive element groups along a circumference going around the top electrodes as a whole of the plurality of capacitive element groups. This eliminates the need to provide the lead-out electrode for each of the capacitive element groups, allowing reduction in area of the plurality of capacitive element groups as a whole. This leads to downsizing of the semiconductor device provided with a plurality of capacitive element groups.

If there is a vacant region free of the unit capacitive elements between the top electrodes as a whole of the capacitive element group and the lead-out electrode, dummy elements can be provided in the vacant region.

This prevents generation of steps as a result of no elements existing in the vacant region, thus facilitating patterning and providing improved patterning accuracy. This in turn leads to improved accuracy in capacitance ratio.

DESCRIPTION OF THE DRAWINGS

The above and other objects, aspects, features and advantages of the present invention will become more apparent from the following detailed description when taken in conjunction with the accompanying drawings, in which:

FIGS. 3A and 3B are circuit diagrams showing examples of configuration of a voltage dividing circuit using the semiconductor device of FIG. 1;

FIGS. 4A to 4C are circuit diagrams showing examples of configuration of a voltage dividing circuit using the semiconductor device of FIG. 2;

DETAILED DESCRIPTION OF THE INVENTION

Figure 5:
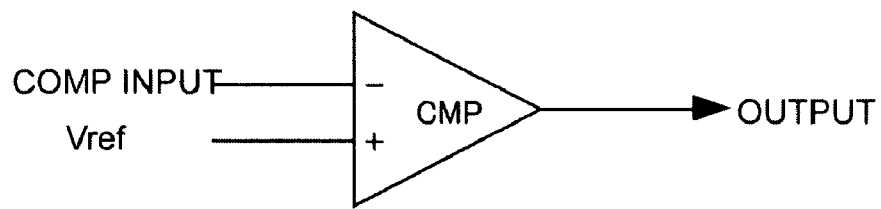
FIG. 5 is a circuit diagram showing a comparator to which the voltage dividing circuits of FIGS. 3A and 3B and FIGS. 4A to 4C are connected.
Figure 6:
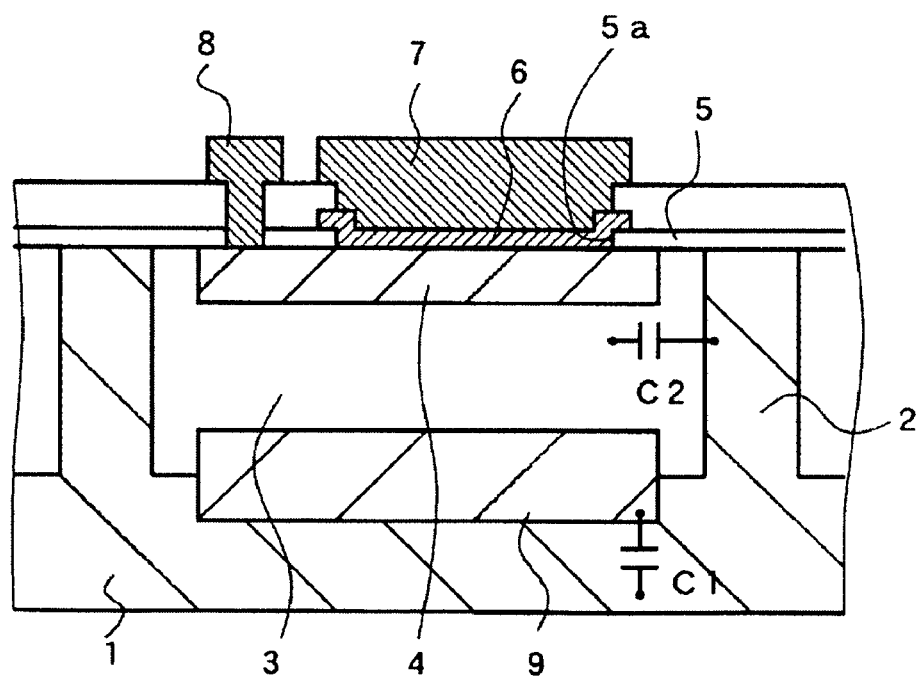
FIG. 6 is a view showing an example of a cross-sectional structure of a unit capacitive element that maybe shared by the conventional art and the present invention.

In FIGS. 1 to 5, the same reference numerals are assigned to components equivalent or identical to conventional components shown in the sectional view of FIG. 6, with their description substituted by the description of the aforementioned related art technology.

Figure 1:
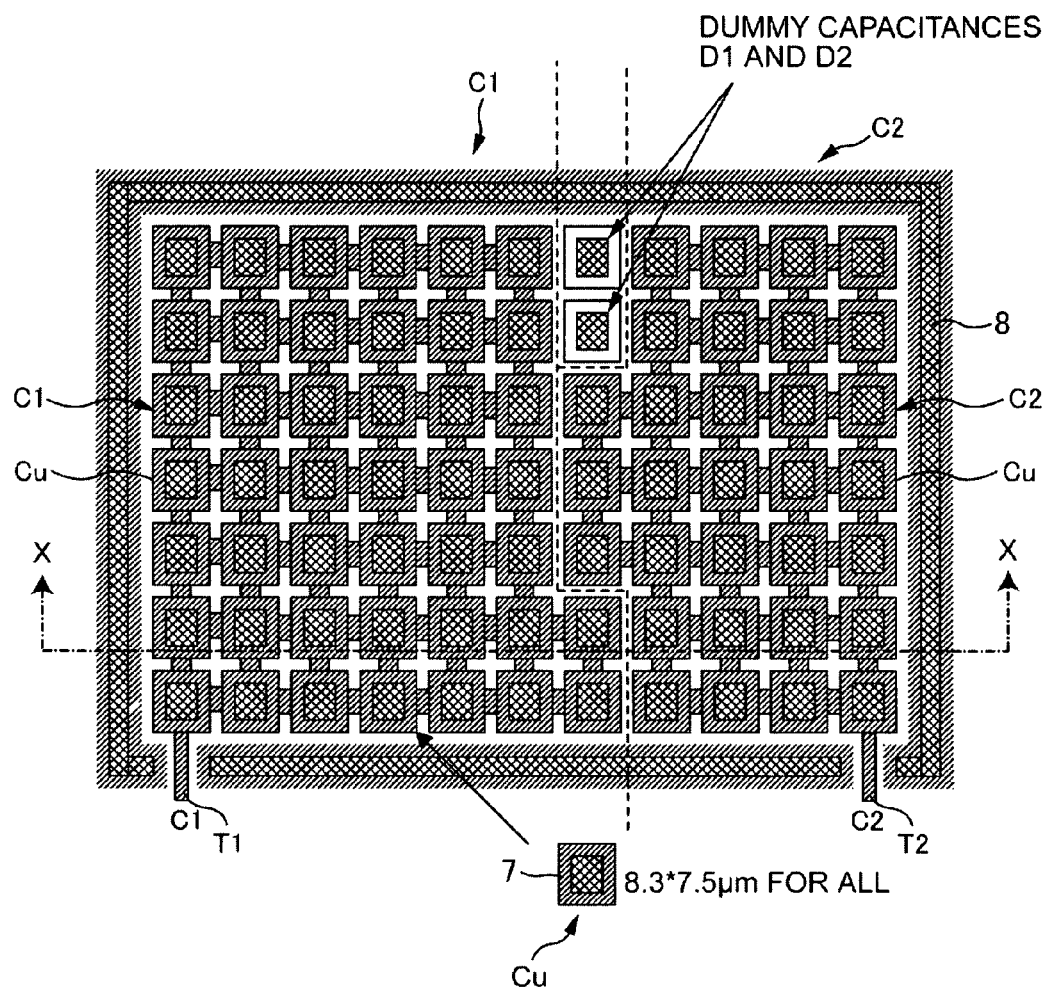
FIG. 1 is a plan view of a semiconductor device according to an embodiment of the present invention.

As shown in the plan view of FIG. 1, the semiconductor device has a pair of capacitive element groups C1 and C2. The left side demarcated by a dashed line is a region of the capacitive element group C1, whereas the right side thereof is a region of the capacitive element group C2. It is to be noted that dummy elements D1 and D2, that will be described later, are provided in a region enclosed by two that the dashed line is split into at the upper portion.

The capacitive element groups C1 and C2 are configured by arranging a number of identical unit capacitive elements Cu. Then, there is provided the lead-out electrode 8 of the bottom electrode of the unit capacitive elements Cu of the capacitive element groups C1 and C2 along the circumference going around the top electrodes 7 as a whole of all the unit capacitive elements Cu.

Figure 7:
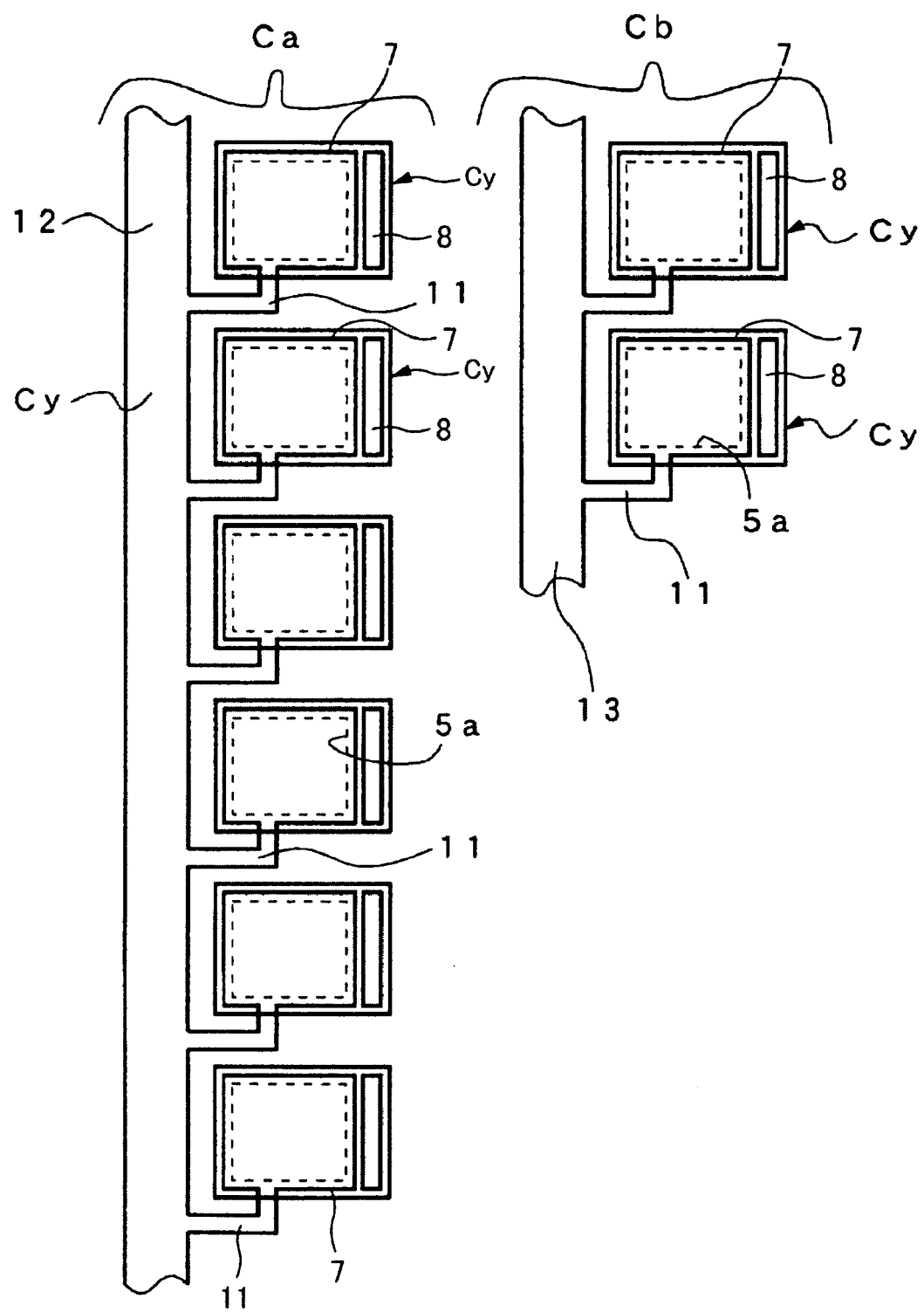
FIG. 7 is a plan view of a layout pattern of the conventional art unit capacitive elements.

Therefore, it is unnecessary, as compared with the aforementioned prior-art layout method shown in FIG. 7, to route the lead-out electrode 8 for each of the unit capacitive elements, allowing downsizing of the semiconductor device through area reduction of the capacitive element group and providing improved patterning accuracy as a result of easier patterning. This in turn ensures improved accuracy of capacitance ratio.

In particular, the lead-out electrode 8 is provided in the shape of a belt so as to surround the top electrodes 7 as a whole of the capacitive element groups C1 and C2. This eliminates the need to provide the lead-out electrode 8 for each of the capacitive element groups C1 and C2, allowing further reduction in area of the capacitive element groups C1 and C2. Moreover, the lead-out electrode 8 is provided so as to surround the top electrodes 7 as a whole, facilitating connection of the lead-out electrode 8 with external and other circuitry.

It is to be noted, however, that, as for the lead-out electrode 8 at areas where it intersects with external connection terminals T1 and T2 of the capacitive element groups C1 and C2, the lead-out electrode 8 is cut to provide space. This allows extraction of the external connection terminals T1 and T2 without these terminals overlapping with the lead-out electrode 8. However, all the bottom electrodes of the capacitive element groups C1 and C2 remain connected with each other despite cutting of the lead-out electrode 8 on the surface.

The unit capacitive elements Cu are arranged in grid form, with the top electrodes 7 of the unit capacitive elements adjacent to each other joined together in the capacitive element groups C1 and C2. This eliminates the need to form a wiring pattern for drawing out the top electrode 7 outwards for each of the unit capacitive elements Cu, making it possible to mount the unit capacitive elements in large number at high density and thereby ensuring further reduction of the capacitive element groups C1 and C2 in area. This leads to further downsizing of the semiconductor device. Arrangement of the unit capacitive elements in grid form provides improved patterning accuracy as a result of easier patterning, thus ensuring improved accuracy in capacitance ratio.

Further, there are arranged dummy capacitive elements in a vacant region generated between the capacitive element groups C1 and C2 and the lead-out electrode 8. This prevents generation of steps as a result of no elements existing in the vacant region, thus facilitating patterning and providing improved patterning accuracy. This in turn leads to improved accuracy in capacitance ratio.

Figure 9:
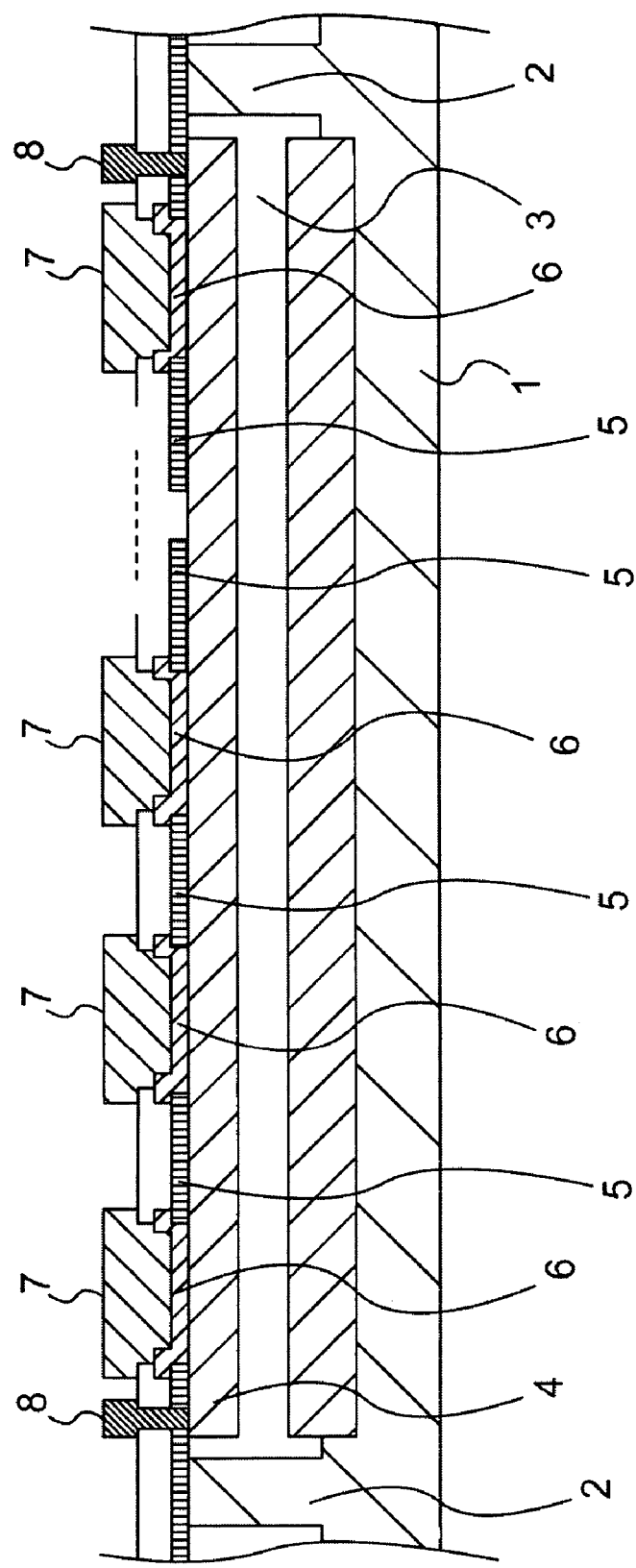
FIG. 9 is a view of the cross-sectional structure of the semiconductor device of FIG. 1.

FIG. 9 is a view of the cross-sectional structure of the semiconductor device of FIG. 1 as seen in the X direction after the semiconductor device is cut along the dot-dashed line straight from the front side of the plane of the Figure to the back side.

A bottom electrode 4 is provided as a continuous electrode under a plurality of the top electrodes 7. The plurality of top electrodes 7 are coupled to the bottom electrode 4 via respective dielectric thin films 6 provided for the top electrodes 7. One lead-out electrode 8 is provided and coupled to the bottom electrode 4 at positions adjacent to the top electrodes 7 located at the ends of the Figure without providing a lead-out electrode 8 for each top electrode 7. By this means, the lead-out electrode 8 can be provided so as to surround the plurality of top electrodes 7 as a whole.

Other Embodiments

Figure 2:
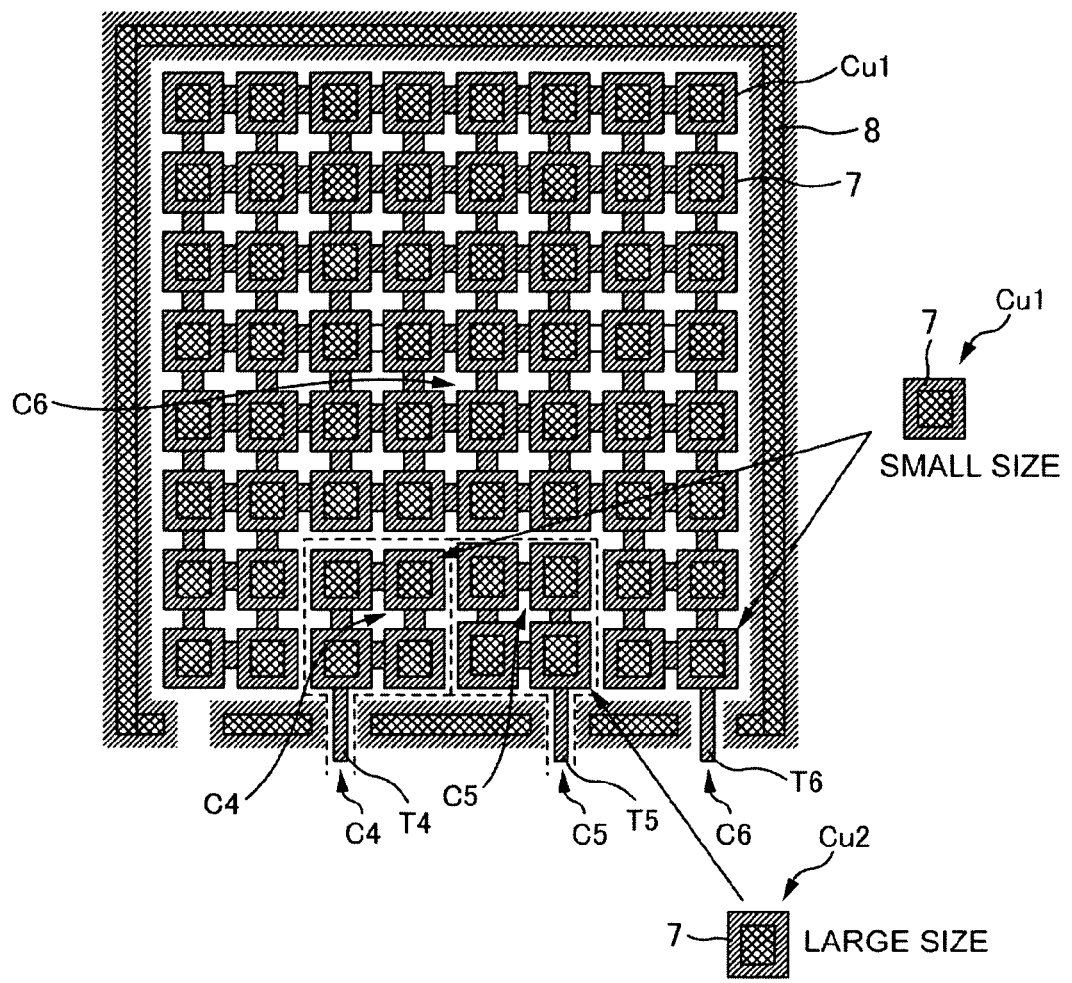
FIG. 2 is a plan view of a semiconductor device according to another embodiment of the present invention.

A semiconductor device according to another embodiment is shown in a plan view of FIG. 2. The following description will focus on differences since there is commonalities/overlap with the semiconductor device described earlier with reference to FIG. 1.

The semiconductor device shown in the plan view of FIG. 2 has three capacitive element groups C4, C5 and C6. Of the two regions enclosed by a dashed line at the bottom, the capacitive element group C4 is arranged on the left side, whereas the capacitive element group C5 is arranged on the right side. There is arranged the capacitive element group C6 in the remaining large region.

The capacitive element group C5 uses unit capacitive elements different in size (capacitance) from those of the capacitive element groups C4 and C6. The capacitive element group C5 is configured by arranging identical unit capacitive elements Cu2 that are relatively larger in size. The capacitive element groups C4 and C6 are each configured by arranging the identical unit capacitive elements Cu1 that are relatively smaller in size.

Then, there is provided the lead-out electrode 8 of the bottom electrodes of the unit capacitive elements Cu of the capacitive element groups C4, C5 and C6 along the circumference going around the top electrodes 7 as a whole of all the unit capacitive elements Cu1 and Cu2 in the capacitive element groups C4, C5 and C6.

<Example of Application to Circuitry for Specific Purpose>

The semiconductor device described with reference to FIG. 1 is used, for example, in voltage dividing circuits capable of ensuring accuracy to 0.1 V shown in FIGS. 3A and 3B. The voltage dividing circuit of FIG. 3A detects 2.0V, a set voltage, with a SOLAR terminal, whereas the one of FIG. 3B detects 2.9V, a set voltage, with an EPR terminal. A capacitance C1 used in the voltage dividing circuits is constituted by the capacitive element group C1 in the semiconductor device in FIG. 1. On the other hand, a capacitance C2 is constituted by the capacitive element group C2 in the semiconductor device in FIG. 1.

The voltage dividing circuit in FIG. 3A has the capacitance C2 connected in series with a parallel circuit of capacitances C0 and C2, each of which is connected to ground at one end. The connection point between the parallel circuit and the capacitance C1, serving as a COMP input terminal, is connected to circuitry at the succeeding stage.

On the other hand, the voltage dividing circuit in FIG. 3B has the capacitance C2 connected in series with a parallel circuit of the capacitances C0 and C1, each of which is connected to ground at one end. The connection point between the parallel circuit and the capacitance C2, serving as the COMP input terminal, is connected to circuitry at the succeeding stage.

A given capacitance ratio of the capacitances C0, C1 and C2 is set for both voltage dividing circuits. As a result, when voltages applied to the input terminals SOLAR and EPR are set voltages of 2.0V and 2.9V as respective references, a voltage with 0.9V as a reference—a common voltage—is obtained from the COMP input terminal, a connection point of the three capacitances. That is, if voltages applied to the input terminals SOLAR and EPR change upward or downward respectively relative to the set voltages 2.0V and 2.9V at the center, the voltage of the COMP input terminal changes upward or downward relative to the common voltage 0.9V as the center.

These voltage dividing circuits can be employed as part of a voltage detection circuit in a measuring instrument such as electronic calipers. That is, a comparator CMP as shown in FIG. 5 can be used as a circuit connected at the succeeding stage to these voltage dividing circuits. That is, the COMP input terminal of each voltage dividing circuit is connected to the inverting input (or non-inverting input) of the comparator CMP. A reference voltage Vref of 0.9V is applied as a comparison reference to the non-inverting input terminal (or inverting input terminal) of the comparator CMP. This configuration provides a positive or negative output from the common comparator CMP as voltages applied to the input terminals SOLAR and EPR of the voltage dividing circuits change relative to the respective set voltages 2.0V and 2.9V as the center.

Next, the semiconductor device described with reference to FIG. 2 is used, for example, in voltage dividing circuits capable of ensuring accuracy to 0.1V shown in FIGS. 4A to 4C. The voltage dividing circuit of FIG. 4A detects a set voltage of 1.3V applied to a VDD terminal, and the voltage dividing circuit of FIG. 4B detects a set voltage of 1.4V applied to the VDD terminal, whereas the voltage dividing circuit of FIG. 4C detects a set voltage of 1.5V applied to the VDD terminal. A capacitance C4 used in the individual voltage dividing circuits is constituted by the capacitive element group C4 in the semiconductor device of FIG. 2. On the other hand, a capacitance C5 used in the individual voltage dividing circuits is configured with the capacitive element group C5 in the semiconductor device of FIG. 2. Further, a capacitance C6 used in the individual voltage dividing circuits is constituted by the capacitive element group C6 in the semiconductor device of FIG. 2.

In the voltage dividing circuit in FIG. 4A, a parallel circuit of the capacitances C4, C5 and C6 is connected in series with a capacitance C3 that is grounded at one end. The connection point between the parallel circuit and the capacitance C3 serves as the COMP input terminal and is connected to a circuit at the succeeding stage.

In the voltage dividing circuit in FIG. 4B, a parallel circuit of the capacitances C4 and C5 is connected in series with a parallel circuit of the capacitances C6 and C3, each of which is grounded at one end. The connection point between the parallel circuits serves as the COMP input terminal and is connected to a circuit at the succeeding stage.

Further, in the voltage dividing circuit in FIG. 4C, the capacitance C4 is connected in series with a parallel circuit of the capacitances C6, C5 and C3, each of which is grounded at one end. The connection point between the parallel circuit and the capacitance C4 serves as the COMP input terminal and is connected to a circuit at the succeeding stage.

For each of the three voltage dividing circuits, a given capacitance ratio of the capacitances C3 to C6 is set. As a result, a voltage with the common voltage of 0.9V as a reference is obtained from the COMP terminal in response to the set voltages of 1.3V, 1.4V and 1.5V as respective references, applied to the input terminals VDD. That is, if voltages applied to the input terminals VDD change upward or downward respectively relative to the set voltages of 1.3V, 1.4V and 1.5V as the center, the voltage of the COMP input terminal changes upward or downward relative to the common voltage 0.9V as the center.

These voltage dividing circuits can be employed as part of a voltage detection circuit in a measuring instrument such as electronic calipers. That is, the comparator CMP as shown in FIG. 5 can be used as a circuit connected at the succeeding stage to these voltage dividing circuits. That is, the COMP input terminal of each of the voltage dividing circuit is connected to the inverting input (or non-inverting input) of the comparator CMP. The reference voltage Vref of 0.9V is applied as a comparison reference to the non-inverting input terminal (or inverting input terminal) of the comparator CMP. This configuration provides a positive or negative output from the common comparator CMP as voltages applied to the input terminals VDD of the voltage dividing circuits change relative to the respective set voltages of 1.3V, 1.4V and 1.5V as the center.

Figure 8:
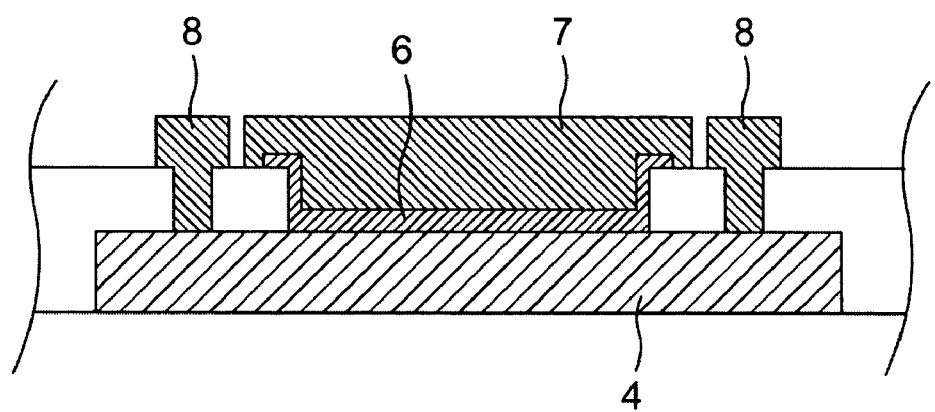
FIG. 8 is a view showing an example of a cross-sectional structure of a unit capacitive element according to an embodiment of the present invention.

While a cross-sectional structure shown in FIG. 6 is taken as an example of the cross-sectional structure of the unit capacitive element, various forms of cross-sectional structures can be applied to the present invention. The cross-sectional structure shown in FIG. 8 is also preferred as an embodiment of the present invention. That is, the lead-out electrode 8 of the bottom electrode is arranged adjacent to the circumference of the top electrode 7 in a cross-sectional structure of a unit capacitive element as shown in FIG. 8.

Downsizing of the semiconductor device is thus achieved through area reduction of the capacitive element group, with improved patterning accuracy as a result of easier patterning. This in turn leads to improved accuracy in capacitance ratio.

While illustrative and presently preferred embodiments of the present invention have been described in detail herein, it is to be understood that the inventive concepts may be otherwise variously embodied and employed and that the appended claims are intended to be construed to include such variations except insofar as limited by the prior art.

It is claimed:

1. A semiconductor integrated circuit comprising at least one capacitive element group having a plurality of unit capacitive elements, wherein
a lead-out electrode for a bottom electrode which is used in common for the unit capacitive elements of the capacitive element group, is provided so as to surround a circumference around top electrodes of the capacitive element group.

2. The semiconductor integrated circuit according to claim 1, comprising a plurality of the unit capacitive element groups, each of which is formed of identical unit capacitive elements.

3. The semiconductor integrated circuit according to claim 2, wherein the unit capacitive elements of each of the plurality of capacitive element groups are arranged in grid form, and wherein the top electrodes of the unit capacitive elements adjacent to each other in each of the plurality of capacitive element groups are joined together, and wherein the top electrodes of the unit capacitive elements adjacent to each other across the capacitive element groups of difference are not joined together.

4. The semiconductor integrated circuit according to claim 2, wherein if there is a vacant region free of the unit capacitive elements between the top electrodes of the plurality of capacitive element groups, surrounded by the lead-out electrode, dummy elements are provided in the vacant region.

5. The semiconductor integrated circuit according to claim 1, wherein a portion of the lead-out electrode of the capacitive element group is cut, and wherein an external connection terminal for at least one of the top electrodes is extendable outwards through the cut.

6. The semiconductor integrated circuit according to claim 1, which is used for a voltage dividing circuit comprising, as a constituent element, the capacitive element group.

* * * * *